(12) United States Patent
El-Hassan et al.

(10) Patent No.: US 10,454,423 B1
(45) Date of Patent: Oct. 22, 2019

(54) TECHNIQUES FOR IMPROVING CELLULAR CURRENT CONSUMPTION

(71) Applicant: Apple Inc., Cupertino, CA (US)

(72) Inventors: Wassim El-Hassan, San Jose, CA (US); Gurusubrahmaniyan Subrahmaniyan Radhakrishnan, San Jose, CA (US); Vineet Nayak, Sunnyvale, CA (US); Srinivasa Yasasvy Sateesh Bhamidipati, Milpitas, CA (US); Jaydeep Vijay Ranade, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/951,946

(22) Filed: Apr. 12, 2018

(51) Int. Cl.
*H03F 1/02* (2006.01)
*H03F 3/19* (2006.01)
*H03F 3/24* (2006.01)
*H03F 1/32* (2006.01)
*H04B 1/04* (2006.01)

(52) U.S. Cl.
CPC ............ *H03F 1/02* (2013.01); *H03F 1/3241* (2013.01); *H03F 3/19* (2013.01); *H03F 3/245* (2013.01); *H04B 1/04* (2013.01); *H03F 2200/102* (2013.01); *H03F 2200/451* (2013.01); *H03F 2201/3215* (2013.01); *H04B 2001/0425* (2013.01)

(58) Field of Classification Search
CPC .................................................... H03F 1/0211
USPC .................................. 330/127, 129, 136, 297
See application file for complete search history.

(56) References Cited

U.S. PATENT DOCUMENTS

| | | | |
|---|---|---|---|
| 6,342,810 B1* | 1/2002 | Wright | H03F 1/3241 330/124 D |
| 8,183,917 B2* | 5/2012 | Drogi | H03F 1/0227 330/129 |
| 8,331,883 B2 | 12/2012 | Sorensen | |
| 8,737,940 B1* | 5/2014 | Langer | H03F 1/025 330/131 |
| 9,041,464 B2 | 5/2015 | Komninakis et al. | |
| 9,049,664 B2 | 6/2015 | Liu et al. | |
| 9,461,590 B2 | 10/2016 | Langer | |
| 9,654,154 B2 | 5/2017 | Subrahmaniyan Radhakrishnan et al. | |
| 9,729,107 B2 | 8/2017 | Nobbe et al. | |
| 9,800,274 B2* | 10/2017 | Yan | H04B 1/0475 |
| 2014/0133526 A1* | 5/2014 | Camuffo | H03F 1/0222 375/219 |
| 2014/0341318 A1 | 11/2014 | Pourkhaatoun et al. | |

(Continued)

*Primary Examiner* — Henry Choe
(74) *Attorney, Agent, or Firm* — Fletcher Yoder PC (57) ABSTRACT

The representative embodiments discussed in the present disclosure relate to techniques in which the operating characteristics (e.g., power consumption) of a power amplifier in a transceiver may be regulated according to an operation mode of the transceiver. More specifically, in some embodiments, different LUTs may be employed for each mode of operation to suitably adjust the supply voltage (e.g., bias voltage) and/or quiescent current input to the power amplifier based on an input signal and a margin by which transmission standards are met. Further, in some embodiments, a method to calibrate a LUT for average power tracking and/or envelope tracking in a transceiver mode of operation may be employed to populate a LUT that may be used to suitably adjust the power and/or current consumption of the power amplifier.

18 Claims, 8 Drawing Sheets

(56) References Cited

U.S. PATENT DOCUMENTS

2016/0164550 A1* 6/2016 Pilgram .................... H03F 3/19
375/295
2017/0279412 A1* 9/2017 Afsahi .................. H03F 1/0222

* cited by examiner

TECHNIQUES FOR IMPROVING CELLULAR CURRENT CONSUMPTION

BACKGROUND

The present disclosure relates generally to cellular and wireless devices and, more particularly, to cellular and wireless devices having a transceiver capable of regulating the operating characteristics of a power amplifier corresponding to operating modes of the transceiver.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Transceivers are commonly included in various electronic devices, and particularly, portable electronic devices such as, for example, phones (e.g., mobile and cellular phones, cordless phones, personal assistance devices), computers (e.g., laptops, tablet computers), internet connectivity routers (e.g., Wi-Fi routers or modems), radios, televisions, or any of various other stationary or handheld devices. Certain types of transceivers, known as wireless transceivers, may be used to generate wireless signals to be transmitted by way of an antenna coupled to a power amplifier in the transceiver. The power amplifier of the transceiver may apply a suitable gain to a signal to increase the signal's strength for better transmission over a channel (e.g., air). To do so, however, the power amplifier may draw significant current, which may consume power and reduce the battery life of an electronic device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

As described in greater detail below, the transceiver may employ different modes of operation (e.g., normal power operation mode and low power operation mode). A normal power operation mode may be used to transmit a signal with characteristics to suitably exceed transmission standards by a certain margin. For example, to limit distortion caused by the mixing (e.g., channel leakage) of signals on adjacent channels (e.g., frequencies), the transceiver may use a power amplifier to adjust a signal's characteristics (e.g., gain) to surpass a specified adjacent channel leakage ratio (ACLR) by an acceptable margin. Further, the margin by which the transmission standards are exceeded may govern the power consumed by the power amplifier to do so. Accordingly, in the low power operation mode, the signal may be transmitted with characteristics to suitably exceed the transmission standards, such as ACLR, by a smaller margin than the normal power operation mode, which may reduce the power consumed by the power amplifier.

In any case, suitable power may be supplied to the power amplifier based on characteristics (e.g., peak voltage, amplitude, and/or an envelope) of the input signal, which may be determined based on average power tracking and/or envelope tracking techniques. More specifically, in some embodiments, by determining combinations of input operating settings of the power amplifier, such as a bias level (e.g., voltage), a quiescent current (ICQ), and/or a radio-frequency gain index (RGI), suitable to meet transmission standards (e.g., ACLR) by a certain margin, the transceiver may be calibrated to operate in the low power operation mode. That is, for example, a look-up table (LUT) may be populated with suitable power operating settings such that in combination with average power tracking and/or envelope tracking of a signal input to the transceiver, suitable power, which may be determined by the bias level and/or the ICQ setting, may be supplied to the power amplifier and/or the gain (RGI) of the input signal may be adjusted. As a result, in some embodiments, the transceiver may be calibrated to suitably adjust the operating settings of the power amplifier in each of a normal power operation mode with average power tracking and/or envelope tracking and in a low power operation mode with average power tracking and/or envelope tracking.

Accordingly, the representative embodiments discussed in the present disclosure relate to techniques in which the operating characteristics (e.g., power consumption) of a power amplifier in a transceiver may be regulated according to an operation mode of the transceiver. More specifically, in some embodiments, different LUTs may be employed for each mode of operation to suitably adjust the supply voltage (e.g., bias voltage) and/or quiescent current input to the power amplifier based on an input signal and a margin by which transmission standards are met. Further, in some embodiments, a method to calibrate a LUT for average power tracking and/or envelope tracking in a transceiver mode of operation may be employed to populate a LUT that may be used to suitably adjust the power and/or current consumption of the power amplifier.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 1:
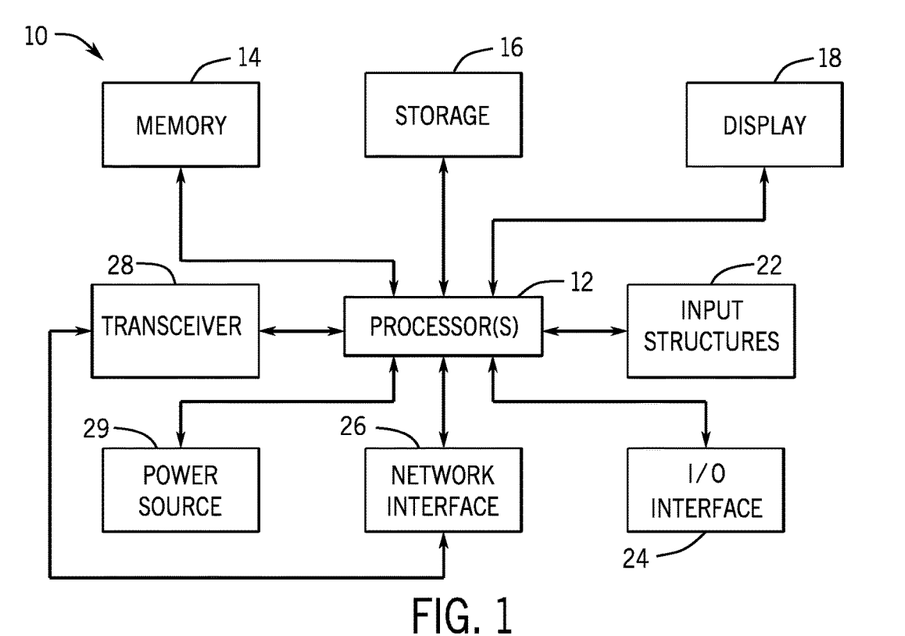
FIG. 1 is a schematic block diagram of an electronic device including a transceiver, in accordance with an embodiment.

With the foregoing in mind, a general description of suitable electronic devices that may employ a transceiver capable of suitably shaping power supplied to a power amplifier across multiple modes of operation will be provided below. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, a transceiver 28, and a power source 29. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
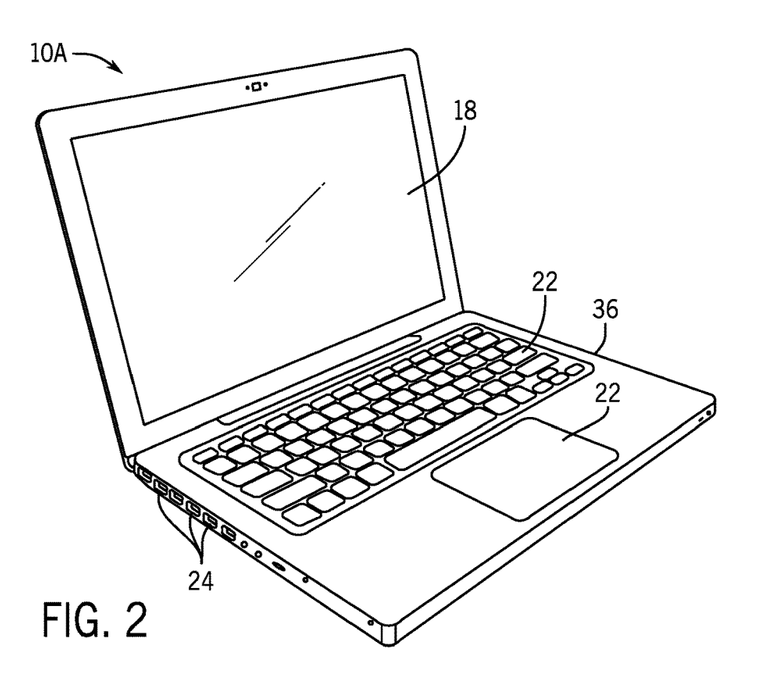
FIG. 2 is a perspective view of a notebook computer representing an embodiment of the electronic device of FIG. 1.
Figure 3:
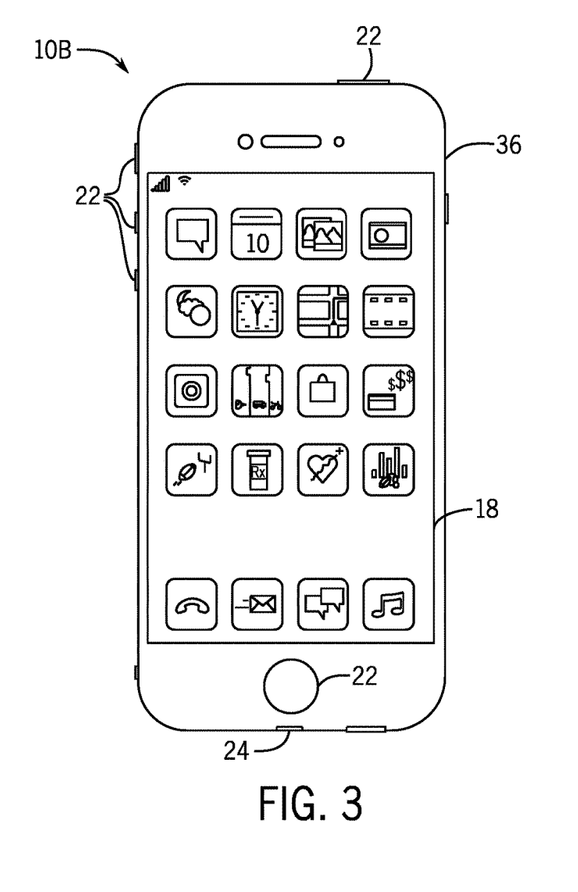
FIG. 3 is a front view of a hand-held device representing another embodiment of the electronic device of FIG. 1.
Figure 4:
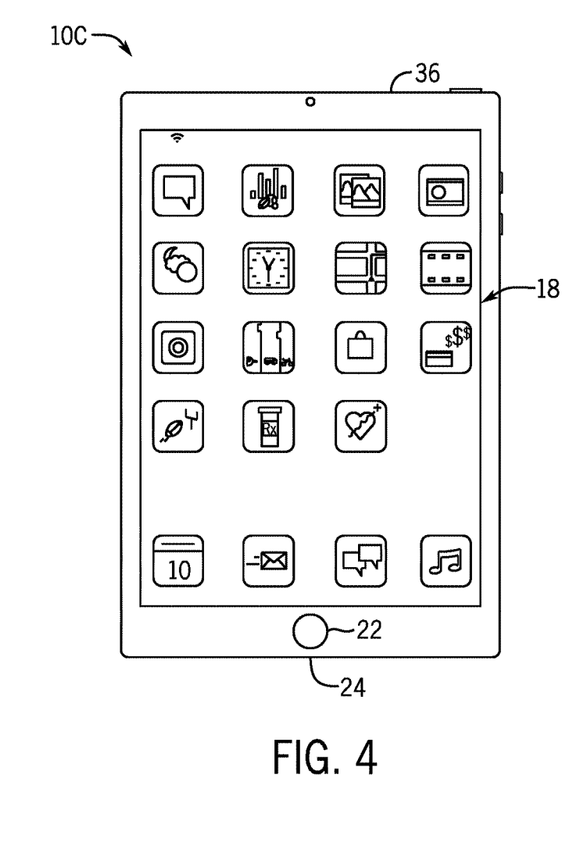
FIG. 4 is a front view of another hand-held device representing another embodiment of the electronic device of FIG. 1.
Figure 5:
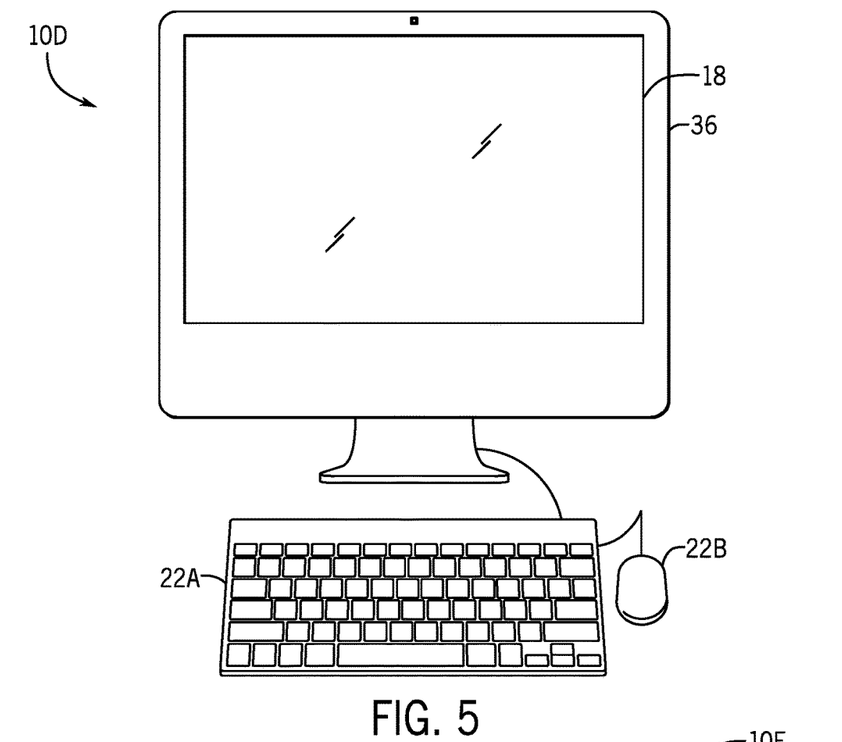
FIG. 5 is a front view of a desktop computer representing another embodiment of the electronic device of FIG. 1.
Figure 6:
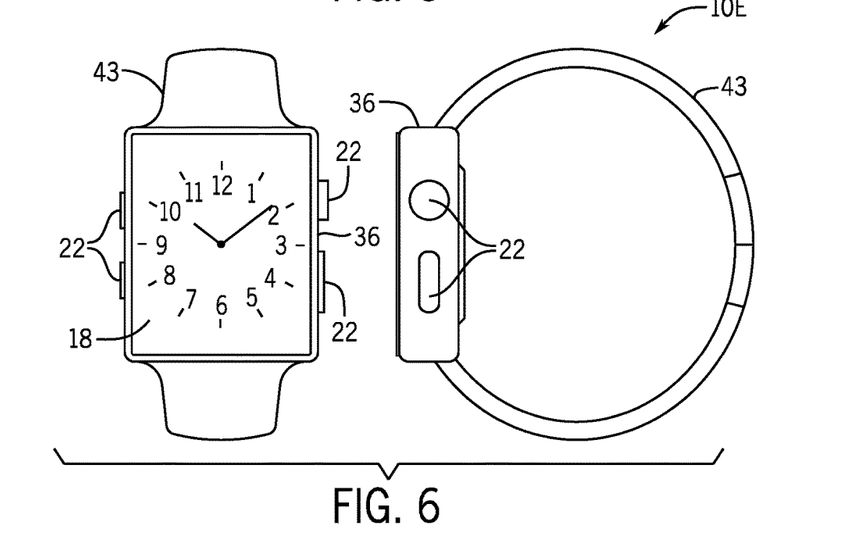
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may be operably coupled with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a $3^{rd}$ generation (3G) cellular network, $4^{th}$ generation (4G) cellular network, long term evolution (LTE) cellular network, long term evolution enhanced license assisted access (LTE-eLAA) cellular network, or long term evolution advanced (LTE-A) cellular network. The network interface 26 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra Wideband (UWB), alternating current (AC) power lines, and so forth.

In certain embodiments, to allow the electronic device 10 to communicate over the aforementioned wireless networks (e.g., Wi-Fi, WiMAX, mobile WiMAX, 4G, LTE, and so forth), the electronic device 10 may include a transceiver 28. The transceiver 28 may include any circuitry the may be useful in both wirelessly receiving and wirelessly transmitting signals (e.g., data signals). Indeed, in some embodiments, as will be further appreciated, the transceiver 28 may include a transmitter and a receiver combined into a single unit, or, in other embodiments, the transceiver 28 may include a transmitter separate from the receiver. For example, the transceiver 28 may transmit and receive OFDM signals (e.g., OFDM data symbols) to support data communication in wireless applications such as, for example, PAN networks (e.g., Bluetooth), WLAN networks (e.g., 802.11x Wi-Fi), WAN networks (e.g., 3G, 4G, and LTE, LTE-eLAA, and LTE-A cellular networks), WiMAX networks, mobile WiMAX networks, ADSL and VDSL networks, DVB-T and DVB-H networks, UWB networks, and so forth. As further illustrated, the electronic device 10 may include a power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hard wired connection for charging and/or content manipulation using a standard connector and protocol, such as the Lightning connector provided by Apple Inc., a universal service bus (USB), or other similar connector and protocol.

Input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various peripheral input devices, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple, Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

Figure 7:
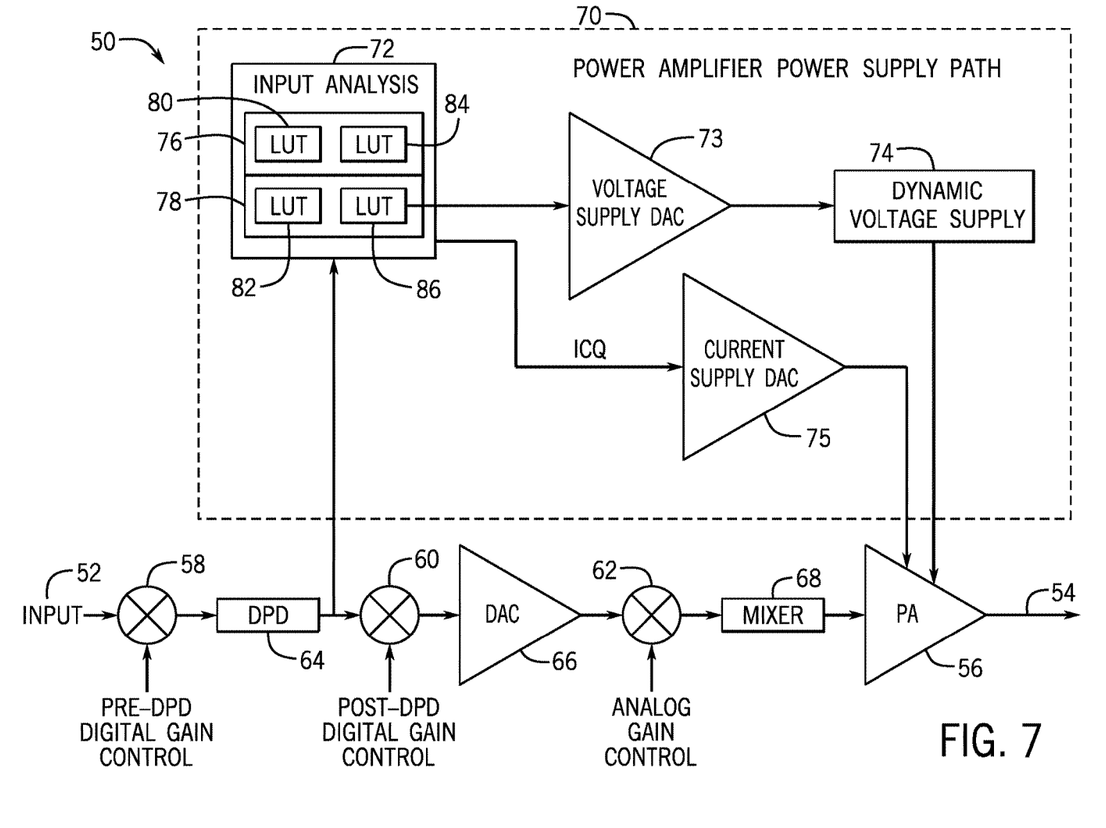
FIG. 7 is a schematic block diagram of an embodiment of the transceiver of FIG. 1 including a power amplifier.

As previously noted above, each embodiment (e.g., notebook computer 10A, handheld device 10B, handheld device 10C, computer 10D, and wearable electronic device 10E) of the electronic device 10 may include a transceiver 28. With the foregoing in mind, FIG. 7 depicts a schematic block diagram of an embodiment of a transmitter 50 within the transceiver 28. In the illustrated embodiment, the transmitter 50 is separate from the receiver within the transceiver 28, but in some embodiments, the transceiver 28 may include a transmitter 50 and a receiver combined into a single unit. Further, the various functional blocks shown in FIG. 7 may include hardware elements (including circuitry), software elements (including computer code stored on a computer-readable medium) or a combination of both hardware and software elements. It should also be noted that FIG. 7 is merely one example of a particular implementation and is intended to illustrate the types of components that may be present in the transmitter 50. As such, functional blocks may be added or omitted, and their arrangement within the transmitter 50 may be modified.

In some embodiments, the transmitter 50 may receive an input signal 52 that, after some modifications, may be transmitted wirelessly via an antenna (not shown) operably connected to an output 54 of the power amplifier (PA) 56. The input signal 52 and the modifications made to input signal 52 to prepare it for transmission may vary depending on an operation mode of the transmitter 50 (e.g., an operation mode of the transceiver 28) and/or the electronic device 10. In some embodiments, the operation modes of the transmitter 50 may include a normal power operation mode and low power operation mode. Further, within each of the operation modes, the transmitter 50 may regulate power supplied to the power amplifier 56 according to average power tracking of the input signal 52 or envelope tracking of the input signal 52.

In any of the operation modes listed above, the input signal 52 may include a single baseband signal or multiple component carriers (e.g., baseband signals). That is, the input signal 52 may include a single signal or a plurality of signals aggregated into one or more frequency bands. In any case, the input signal 52 may be susceptible to several types of noise and/or distortion whose effects may be reduced by the transmitter 50. For example, contiguously aggregated component carriers in the input signal 52 may be susceptible to mixing (e.g., adjacent channel leakage) due to their proximity to each other. Further, non-contiguously aggregated signals may suffer from intermodulation products, and single baseband signals may be susceptible to adjacent channel leakage at a base station receiving one or more baseband signals on proximate channels (e.g., frequencies). As such, to limit distortion and to meet standards specified by the 3rd Generation Partnership Project (3GPP), such as adjacent channel leakage ratios (ACLR), the transmitter 50 may implement techniques to regulate the power supplied to and subsequently, the operating characteristics, such as gain, current consumption, efficiency, and/or the like, of the power amplifier 56, as will be discussed in further detail below.

In the normal power operation mode, the transmitter 50 may use average power tracking or envelope tracking of the input signal 52 to transmit an output signal 54 that suitably exceeds requirements, such as an ACLR (e.g., −33 decibels (dB)), set by 3GPP by a certain margin (e.g., 6-7 dB). Meeting these requirements may govern the power supplied to and/or consumed by the power amplifier 56. In some embodiments, for example, increasing the power supplied to and/or consumed by the power amplifier 56 may increase the margin by which the ACLR standard is met. That is, for example, increasing a quiescent current (ICQ) (e.g., no-load collector current) of the power amplifier 56, may increase power consumed by the power amplifier 56 and may increase the linearity of the power amplifier 56 such that the power amplifier 56 may apply linearly increasing gain as the power input to the power amplifier 56 increases. In some embodiments, increasing the linearity of the power amplifier 56 may improve the ACLR resulting in a signal output from the power amplifier 56. Accordingly, in the low power operation mode, by reducing the margin by which the output signal 54 exceeds transmission standards, such as the ACLR, to, for example, 0.5 dB, the transmitter 50 may reduce the power supplied to and/or consumed by the power amplifier 56. Further, reducing power supplied to and/or consumed by the power amplifier 56 may reduce the power consumed by the electronic device 10 and may extend the life of (e.g., reduce current output by) the power source 29, such as a battery. To reduce the margin, the low power operation mode may use average power tracking or envelope tracking techniques calibrated, as discussed in greater detail below, to save power compared to those used in the normal power operation mode.

Before transmission of the output signal 54 in either normal power operation mode or low power operation mode, a pre-digital pre-distortion (pre-DPD) digital gain control 58 may apply a gain to the input signal 52. The pre-DPD digital gain control 58, as well as other gain control elements (e.g., post-DPD digital gain control 60 and analog gain control 62) in the transmitter 50 may apply gain to a signal so that the amplitude of an output signal of the gain control element is within a suitable operating range of the circuitry that may receive the output signal of the gain control element as an input. As such, the digital pre-distortion (DPD) block 64 may apply distortion to the output of the pre-DPD digital gain control 58 to offset distortion the power amplifier 56 may introduce. That is, the DPD block 64 may introduce distortion intended to have the opposite effect on the signal compared to the distortion the power amplifier 56 may introduce. The output of the DPD block 64 may then have additional gain applied to it by a post-DPD digital gain control 60. A digital-to-analog converter (DAC) 66 may convert the output of the post-DPD digital gain control 60 from a digital to an analog signal to prepare the signal for transmission across an analog channel (e.g., air). An analog gain control 62 may apply an analog gain to the analog signal output from the DAC 66. A mixer 68 may receive an output of the analog gain control 62 as an input and adjust (e.g., shift) the frequency of the signal to a suitable frequency for the channel the signal will be transmitted on. The mixer 68 may additionally or alternatively perform frequency modulation (FM) or amplitude modulation (AM) to modify the frequency or amplitude of the signal, respectively. The output of the mixer 68 may then feed into an input of the power amplifier 56 for amplification to an output signal 54 suitable for transmission across a channel.

Further, in some embodiments, to control the power supplied to the power amplifier 56, the transmitter 50 may contain a power amplifier power supply path 70. The power amplifier power supply path 70 may include input analysis block 72, a voltage supply DAC 73, a dynamic voltage supply 74, a current supply DAC 75 and/or the like. The input analysis block 72 may receive an input signal, such as input signal 52 or the output of the DPD block 64, as illustrated, and may output one or more signals suitable to modulate the power (e.g., current and/or voltage) supplied to the power amplifier 56 based at least in part on one or more characteristics (e.g., amplitude, envelope, and/or the like) of the input signal. That is, in some embodiments, the input analysis block 72 may generate one or more signals to set the ICQ and/or the voltage supplied to the power amplifier 56, which alone or in combination may govern the power supplied to the power amplifier 56. To do so, the input analysis block 72 may contain a number of look up tables (LUTs) that map input signal characteristics to suitable power amplifier 56 power supplies. Since suitable modulation (e.g., regulation) of the power supplied to the power amplifier 56 may depend on the mode of operation of the transmitter 50, the input analysis block 72 may contain a look up table (LUT) corresponding to each mode of operation of the transmitter 50. Accordingly, the input analysis block 72 may include a first set of LUTs 76 for the normal power operation mode and a second set of LUTs 78 for the low power operation mode. The first set of LUTs 76 and the second set of LUTs 78 may each contain a LUT related to regulating power supply based on average power tracking (e.g., 80 and 82, respectively) and a LUT related to regulating power supply based on envelope tracking (e.g., 84 and 86, respectively).

To regulate the power supplied to the power amplifier 56 based on average power tracking, the power amplifier power supply path 70 may track the peak power of a signal input to the input analysis block 72, which may be proportional to the peak power of the signal input to the power amplifier 56 from the output of the mixer 68. The power amplifier power supply path 70 may then operate to ensure that the peak power of the signal input to the input analysis block 72 will not approach the power supplied to the power amplifier 56. While ensuring the peak power of the signal input to the input analysis block 72 does not approach the power supplied to the power amplifier 56, the power amplifier power supply path 70 may reduce the power supplied to the power amplifier 56 when the peak power is suitably low and may increase the power supplied to the power amplifier when the peak power begins to approach the power supplied to the power amplifier 56. However, as discussed in greater detail below, the power supplied to the power amplifier 56 may remain relatively constant over a set period of time, as the power amplifier power supply path 70 may adjust the power supplied after the average power of the input signal changes.

To regulate the power supplied to the power amplifier 56 based on envelope tracking, the power amplifier power supply path 70 may respond to changes in a smooth curve tracking the crests and/or troughs of the amplitude (e.g., envelope) of the input signal 52 and/or a signal input to the input analysis block 72. In such embodiments, the power amplifier power supply path 70 may modulate the power supplied to the power amplifier 56 based on shape of the input signal's 52 envelope. As such, instead of remaining relatively constant until the average of the input signal's 52 power changes, the power supplied to the power amplifier 56 may increase and decrease according to a current shape of the input signal's envelope.

In any case, to implement the average power tracking or the envelope tracking techniques in the normal power operation mode or the low power operation mode, the input analysis block 72 may determine a suitable LUT (80, 82, 84, or 86) to reference based on a current operating mode of the transmitter. Then, after the input analysis block 72 receives an input, such as input signal 52 or the output of the DPD block 64, the input analysis block 72 may determine a suitable power supply (e.g., current and/or voltage) corresponding to one or more characteristics, such as the peak power or the envelope, of the input signal based on information contained in the suitable LUT (80, 82, 84, or 86). The input analysis block 72 may then output information related to the suitable power supply to the voltage supply DAC 73, which may convert the information from a digital signal to an analog signal. Accordingly, a dynamic voltage supply 74, such as an envelope modulator, may receive the analog signal related to the suitable power supply and may feed a suitable supply voltage to the power amplifier 56 based in part on the analog signal. Further, in some embodiments, the input analysis block 72 may output the same or additional information related to the suitable power supply to the current supply DAC 75. In such embodiments, the current supply DAC 75 may convert this information from a digital signal to an analog signal and may supply a current to set the ICQ of the power amplifier 56 to a suitable level.

The illustrated embodiment of the input analysis block 72 includes a first set of LUTs 76 and a second set of LUTS 78, each of which contain a LUT corresponding to average power tracking (e.g., 80 and 82, respectively) and a LUT corresponding to envelope tracking (e.g., 84 and 86, respectively). However, it should be appreciated that in some embodiments the LUTs 80, 82, 84, and 86 may not be stored in the input analysis block 72; rather, the LUTs 80, 82, 84, and 86 may be stored in non-volatile memory and loaded into the input analysis block 72 before they are used. Further, while four LUTs (e.g., 80, 82, 84, and 86) are illustrated, any suitable number of LUTs may be used. In some embodiments, for example, a single LUT may be used across every operation mode of the transmitter 50. In such embodiments, the LUT may include data for each operation mode of the transmitter 50 organized into different sections within the table that may each map to a respective operation mode. Further, while the illustrated embodiment demonstrates the power supplied to the power amplifier 56 being modulated in terms of a dynamic voltage supplied by the dynamic voltage supply 74 and by a dynamically set ICQ, embodiments of the power amplifier power supply path 70 may include any suitable combination of the dynamically supplied voltage or dynamically supplied current, which may be implemented by any suitable combination of the illustrated and/or additional or fewer functional blocks (e.g., 72, 73, 74, and/or 75).

Figure 8:
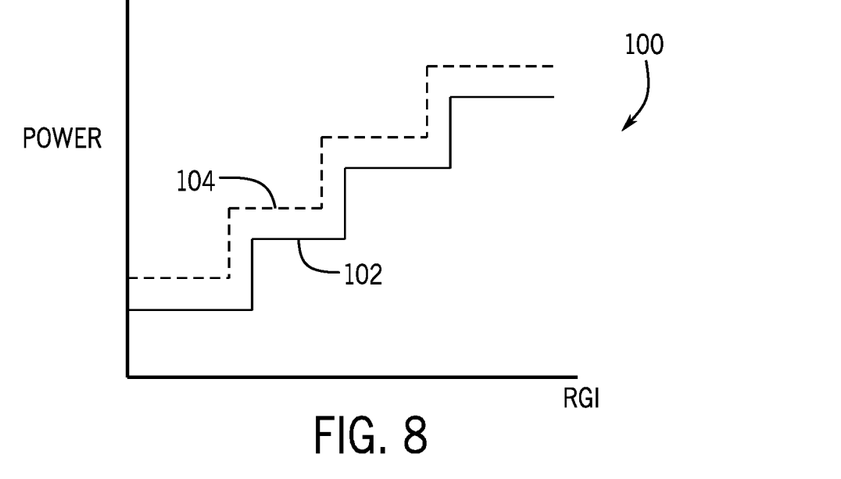
FIG. 8 is an embodiment of the plot of power consumed by the power amplifier of FIG. 7 operating using average power tracking versus radio frequency gain of a signal input to the power amplifier.

To facilitate discussion of the operating characteristics of the power amplifier 56 using average power tracking, FIG. 8 illustrates a plot 100 of a power amplifier's 56 supply power versus a radio frequency gain index (RGI), which may indicate a peak voltage of a signal input to the power amplifier 56. The peak voltage may be representative of peak power of this signal. The solid curve 102 may illustrate increasing power supply demand at the power amplifier 56 for increasing RGIs of the signal input to the power amplifier 56, while the dashed curve 104 may represent the actual power supplied to the power amplifier 56 in response to the signal with an increasing RGI. As discussed above, during average power tracking, the transmitter 50 may adjust the power supplied to the power amplifier 56 after the average power of the input signal changes, which may result in relatively constant power supplied over a set period of time. Accordingly, the dashed curve 104 may remain relatively constant over a range of RGIs until the peak power of the input signal begins to approach the power supplied by the power amplifier 56 and the power supplied to the power amplifier 56 is increased (e.g., stepped up a level).

Figure 9:
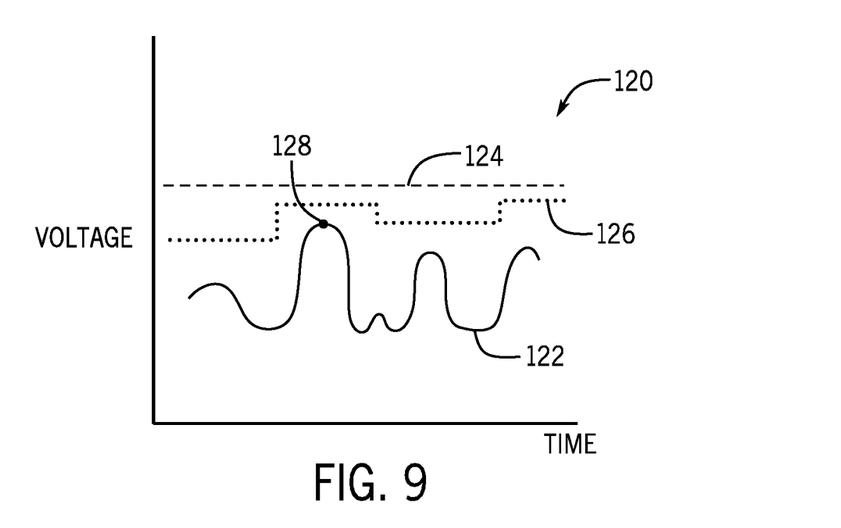
FIG. 9 is an embodiment of the plot of a function of voltage supplied to the power amplifier of FIG. 7 operating using average power tracking versus time.

For a more detailed depiction of average power tracking over a varying input signal, FIG. 9 illustrates a plot 120 of voltage versus time for an input signal curve 122, a normal power operation mode voltage supply curve 124, and a low power operation mode voltage supply curve 126. Accordingly, the input signal curve 122 may be representative of the shape of the input signal 52 over time and/or of the signal input to the power amplifier 56. The normal power operation mode voltage supply curve 124 may represent the voltage and/or power, which is proportional to the voltage, supplied to the power amplifier 56 in a normal power operation mode using average power tracking. Accordingly, while the amplitude of the input signal curve 122 may vary over time, the normal power operation mode voltage supply curve 124 may remain relatively constant and at a voltage level greater than the peak voltage 128 of the input signal curve 122.

As discussed herein, to reduce power consumed at the power amplifier 56, the transmitter 50 may operate in a low power operation mode. In the low power operation mode, to reduce the margin by which signal transmission requirements, such as ACLR, are exceeded by, the average power tracking illustrated in the normal power operation mode power supply curve 124 may be modified to produce the low power operation mode voltage supply curve 126. More specifically, the average power tracking techniques employed by the power amplifier power supply path 70 may be modified to reduce the margin between peak voltages (e.g., peak voltage 128) supplied in the input signal curve 122 and the voltage (e.g., power) supplied to the power amplifier 56. Accordingly, the power consumed by the power amplifier 56 may be reduced. Further, the average power tracking techniques resulting in low power operation mode voltage supply curve 126 may include increasing the sensitivity of the power amplifier power supply path 70 to changes in the input signal curve's 122 average and/or peak power, which may increase the frequency with which the low power operation mode voltage supply curve 126 fluctuates between voltage levels compared to the normal power operation mode power supply curve 124.

Accordingly, in some embodiments, the power amplifier power supply path 70 may use a LUT 80 having values mapping a suitable power supply (e.g., voltage supply) to the power amplifier 56 based on an input signal and average power tracking in normal power operation. Using this LUT 80, the power supplied to the power amplifier 56 by the power amplifier power supply path 70 may generally resemble the normal power operation mode voltage supply curve 124 for an input signal corresponding to the input signal curve 122. The power amplifier power supply path 70 may use a different LUT 82 having values mapping a lower power supply (e.g., voltage supply and/or ICQ) to the power amplifier 56 than the suitable power supply discussed above based on the same input signal and average power tracking in low power operation. Accordingly, using this LUT 82, the power supplied to the power amplifier 56 by the power amplifier power supply path 70 may generally resemble the low power operation mode voltage supply curve 126 for an input signal corresponding to the input signal curve 122. Further, the power amplifier power supply path 70 may use a LUT 86 having values mapping a suitable power supply (e.g., voltage supply and/or ICQ) to the power amplifier 56 based on an input signal and envelope tracking in normal power operation, and the power amplifier power supply path 70 may use a LUT 88 mapping a different power supply (e.g., voltage supply) to the power amplifier 56 based on the input signal and envelope tracking in low power operation, which may reduce the power consumed by the power amplifier 56 and may reduce the margin by which a signal transmitted by the transmitter 50 exceeds transmission standards, such as ACLR.

Figure 10:
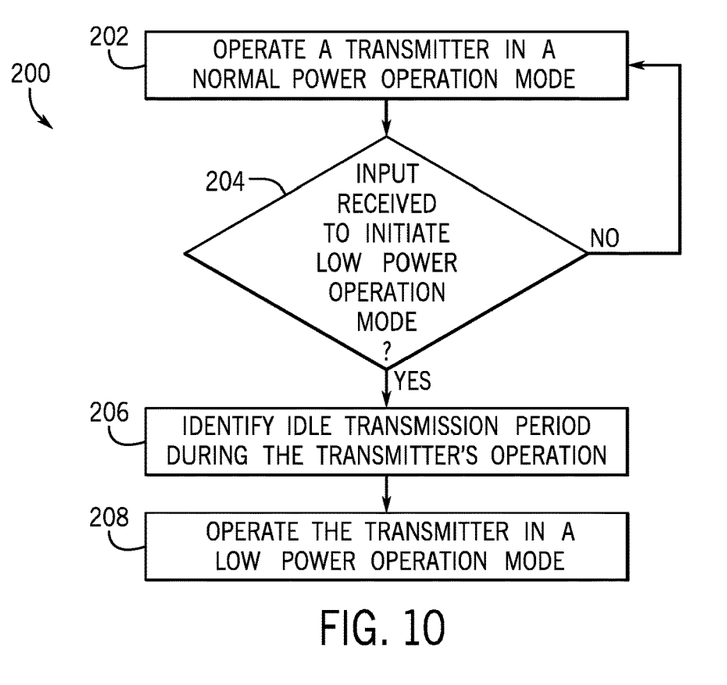
FIG. 10 is a block diagram of a method to coordinate operation of the transceiver of FIG. 1 between a normal power operation mode and a low power operation mode, in accordance with an embodiment.

Turning now to FIG. 10, a flow chart of a method 200 operating the transmitter 50 in either the normal power operation mode or the low power operation mode is illustrated, in accordance with embodiments described herein. Although the description of the method 200 is described in a particular order, which represents a particular embodiment, it should be noted that the method 200 may be performed in any suitable order, and steps may be added or omitted.

In some embodiments, the transmitter 50 may be operated in a normal power operation mode (process block 202). As described herein, during operation, the transmitter 50 may transmit signals amplified by the power amplifier 56 over an analog channel (e.g., air) via, for example, an antenna. Further, during normal power operation mode, the transmitter 50 may use a LUT 80 corresponding to average power tracking or a LUT 84 corresponding to envelope tracking to suitably supply power, via the power amplifier power supply path 70, to the power amplifier 56. In some embodiments, the transmitter 50 may determine whether to use the LUT 80 corresponding to average power tracking or a LUT 84 corresponding to envelope tracking based at least in part on the strength of a connection established with, which may depend on proximity to, a base station (e.g., cellular tower) receiving the transmitted signal. Further, by using normal power operation mode, as discussed herein, the transmitter 50 may exceed transmission standards, such as ACLR, by a first margin when transmitting a signal.

If, during normal power operation mode, the transmitter 50 receives an input to initiate operation in low power operation mode (decision block 204), the transmitter 50 may prepare to switch to low power operation mode. In some embodiments, the input may be received at the electronic device 10, via, for example, one or more of the input structures 22 and/or the display 18. Additionally or alternatively, the one or more processor(s) 12 of the electronic device 10 may detect that an estimated life (e.g., remaining voltage) of the power source 29 has dropped below a certain threshold (e.g., 10% or 20%). In any case, the electronic device 10 may transmit the input to the transmitter 50, via, for example, the one or more processor(s) 12 to initiate the use of low power operation mode.

To prepare to switch to low power operation mode, the transmitter 50 and/or the one or more processor(s) 12 may identify an idle transmission period during the transmitter's 50 operation (process block 206), or a period of time where the transmitter 50 is not transmitting a signal. As switching the operating mode of the transmitter 50 may impact the gain and/or other characteristics applied to a signal output from the power amplifier 56, identifying the idle transmission period may facilitate a change in transmitter 50 operation modes that does not disrupt (e.g., distort) a signal transmitted by the transmitter 50.

After identifying the idle transmission period, the one or more processor(s) and/or the transmitter 50 may switch the operating mode of the transmitter 50 to the low power operation mode (process block 208). To do so, the transmitter 50 may use the LUT 82 corresponding to average power tracking or the LUT 86 corresponding to envelope tracking in the low power operation mode. As described above, the transmitter 50 may determine whether to use the LUT 82 or the LUT 86 based at least in part on the strength of a connection established with a base station receiving the transmitted signal. In any case, the transmitter 50 may then operate in low power operation mode (process block 208) and may reduce the power consumed by the power amplifier 56 compared to the power consumed in the normal power operation mode.

If, however, an input is not received to initiate the low power operation mode (decision block 204), the transmitter 50 may continue to operate in the normal power operation mode. Further, in some embodiments, if after operating the transmitter 50 in low power operation mode, the transmitter 50 receives an input to initiate normal power operation mode, an idle transmission period may be identified and the transmitter may switch operation to the normal power operation mode. In such cases, the input to use normal power operation mode may be received, for example, from one or more of the input structures 22, upon detection of an estimated life of the power source 29 above some threshold, and/or detection of active charging (e.g., increasing voltage) of the power source 29.

Figure 11:
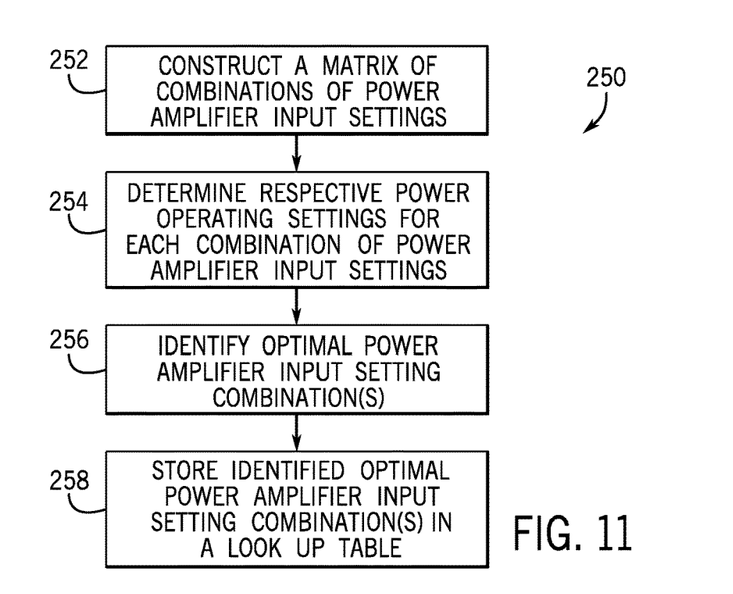
FIG. 11 is a block diagram of a method to calibrate the transceiver of FIG. 1, in accordance with an embodiment.

With the foregoing in mind, FIG. 11 illustrates a flow chart of a method 250 for calibrating the LUT 82 corresponding to average power tracking in the low power operation mode so that the power amplifier power supply path 70 may apply suitable power at the power amplifier 56 to meet transmission standards by a lower margin than in normal power operation mode, in accordance with embodiments described herein. The method 250 may be used to calibrate the second LUT 82 when the transmitter 50 is built, reset, reconfigured, and/or in any other suitable scenario. Further, although the description of the method 250 is described in a particular order, which represents a particular embodiment, it should be noted that the method 250 may be performed in any suitable order, and steps may be added or omitted.

To initiate the method 250, a matrix of combinations of different power amplifier input settings may be constructed (process block 252). As described in greater detail below, the input settings may include a bias level (e.g., supply voltage and/or supply power), which may be provided by the power amplifier power supply path 70, a quiescent current (ICQ), which may correspond to current flowing through the power amplifier 56 in the absence of a load (e.g., signal to transmit), and RGI, which may be representative of the peak voltage of a signal input to the power amplifier 56.

After the matrix of suitable combinations of different power amplifier input settings is constructed, power operating settings of the power amplifier 56 for each combination of power amplifier input settings may be determined (process block 254). The power operating settings may include the power consumed by the power amplifier 56, the ACLR of a signal transmitted under the power amplifier input settings, a margin by which the transmitted signal exceeds or fails to meet a specified ACLR, and/or the like. Accordingly, the power amplifier 56 may be tested under each of the combinations of settings included in the matrix to determine the operating settings of the power amplifier 56 resulting from each combination of input settings. To do so, in some embodiments, the transmitter 50 may contain and/or may be connected to a switch matrix (not shown), which may facilitate testing of the power amplifier 56 under multiple conditions. Additionally or alternatively, the operating settings of the power amplifier 56 for one or more of the combinations of input settings included in the matrix may be determined based in part on existing characterization of the power amplifier 56 and/or of other hardware included in the transmitter 50.

After the power operating settings of the power amplifier 56 are identified for each of the combinations of power amplifier input settings in the matrix, one or more optimal power amplifier input setting combinations may be identified (process block 256). In some embodiments, an optimal power amplifier input setting combination may contain, for a given bias level and RGI, the lowest ICQ value resulting in power amplifier operating settings that exceed a specified ACLR within a margin to suitably operate in low power operation mode while maintaining transmission standards. As the power consumed by the power amplifier 56 may be proportional to the power supplied (e.g., bias level and/or ICQ) to the power amplifier 56, operating the power amplifier 56 with reduced ICQ may reduce the power consumed by the power amplifier 56. Further, in some embodiments, reducing the ICQ of the power amplifier 56 may result in the most power savings at the power amplifier 56 when compared to power savings resulting from changes in bias levels and/or RGI.

Identified optimal power amplifier input settings may be stored in a LUT, such as LUT 82 (process block 258). Accordingly, by storing a number of optimal power amplifier input settings in LUT 82, during operation of the transmitter 50 in low power operation mode, the power amplifier power supply path 70 may configure the power amplifier 56 to operate with suitable operating settings by generating these input power amplifier settings in combination with the input signal 52 and/or the signal input to the power amplifier 56. That is, for example, the power amplifier power supply path 70 may receive, at the input analysis block 72 an input signal having a certain RGI, and based on this RGI, the input analysis block 72 may determine the lowest ICQ setting to use in combination with a bias level (e.g., voltage supply) and the RGI based on the optimal power amplifier input settings stored in the LUT 82. The power amplifier power supply path 70 may suitably generate and/or feed the identified ICQ and/or bias level to the power amplifier 56 so that the power amplifier 56 may operate with suitable power amplifier operating settings during amplification of the input signal with the certain RGI. Further, in some embodiments, the transmitter 50 may modify the RGI of a signal with, for example, the pre-DPD digital gain control 58, the post-DPD digital gain control 60, and/or any other suitable digital gain control to generate a signal with a suitable RGI, as identified by the optimal power amplifier input settings stored in the LUT 82. In such cases, as RGI may be adjusted digitally, minimal to no additional power may be used in the transmitter 50 to implement these changes.

Figure 12:
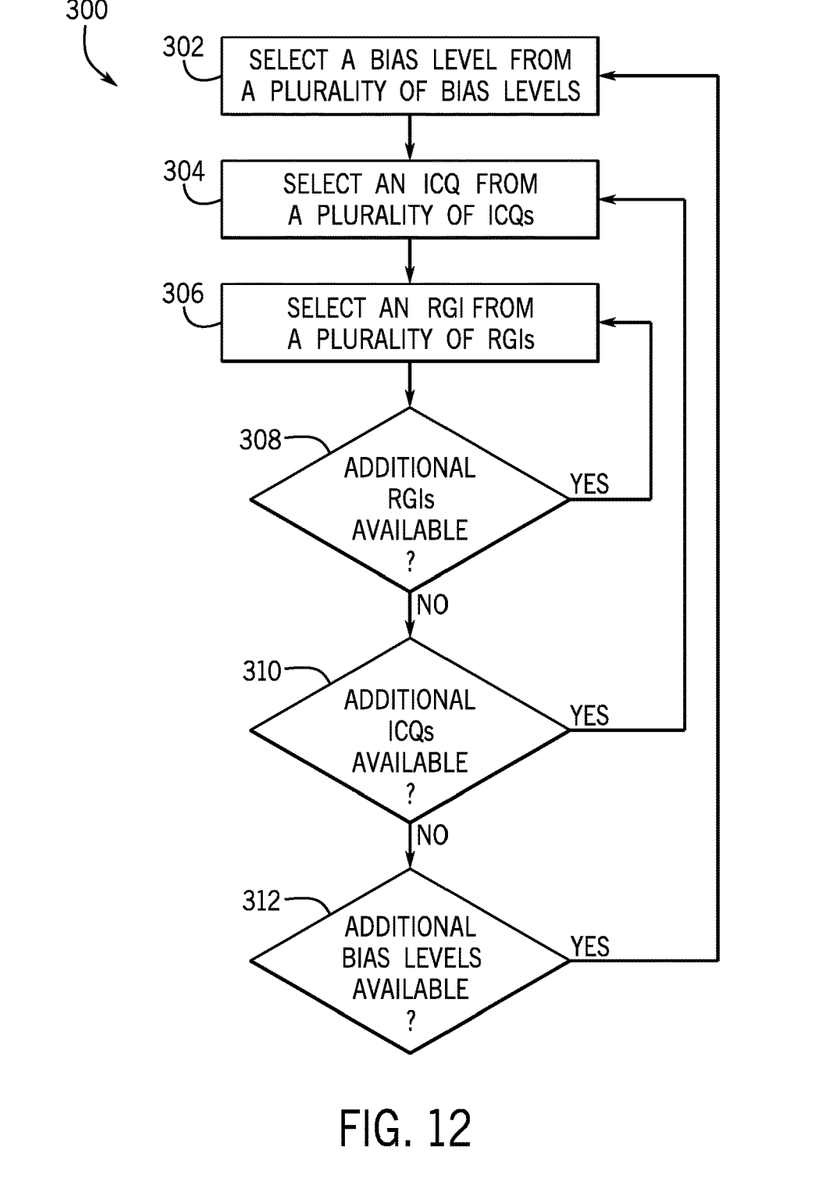
FIG. 12 is a block diagram of a method to construct a matrix for the calibration of the transceiver of FIG. 1, in accordance with an embodiment.

Turning to FIG. 12, to construct the matrix of combinations of power amplifier input settings (process block 252), the method 300 may be implemented. While the description of the method 300 is described in a particular order, which represents a particular embodiment, it should be noted that the method 300 may be performed in any suitable order, and steps may be added or omitted.

To begin constructing the matrix, a bias level (e.g., supply voltage) may be selected (process block 302) from among one or more suitable bias levels. In some embodiments, the suitable bias levels may span the range of supply voltages the power amplifier 56 is capable of receiving. Further, the difference between two adjacent bias levels may be determined based on the power amplifier's 56 sensitivity to changes in supply voltages and/or may be determined by the dynamic voltage supply's 74 capability to generate each bias level.

In any case, after selecting a bias level for the matrix, an ICQ may be selected (process block 304) from among one or more suitable ICQ values. In some embodiments, the suitable ICQs may span the range of ICQs the power amplifier 56 is capable of receiving. Further, the difference between two ICQs may be determined based on the power amplifier's 56 sensitivity to changes in ICQ and/or may be determined by the power amplifier power supply path's 70 capability to generate each ICQ. Additionally, the suitable ICQs may vary depending on the bias level selected (e.g., at process block 302). Accordingly, by selecting the ICQ, the matrix may contain a suitable combination of the selected bias level and the selected ICQ for a power amplifier's 56 operation.

After selecting the ICQ, an RGI may be selected (process block 306) from among one or more suitable RGIs. In some embodiments, the suitable RGIs may span the range of RGIs the power amplifier 56 is capable of receiving via a signal input to the power amplifier 56 for amplification. Further, the difference between two RGIs may be determined based on the power amplifier's 56 sensitivity to changes in RGI and/or may be determined by the transmitter's 50 capability to generate each RGI, which may be determined by gain components, such as the pre-DPD digital gain control 58 and/or the post-DPD digital gain control 60, among other things. Additionally, the suitable RGI may vary depending on the bias level selected (e.g., at process block 302) and/or based on the ICQ selected (e.g., at process block 304). Accordingly, by selecting the RGI, the matrix may contain a suitable combination of the selected bias level, the selected ICQ, and the selected RGI for a power amplifier's 56 operation.

To construct the rest of the matrix, additional combinations of bias levels, ICQs, and RGIs may be selected. Accordingly, if there are additional RGIs for a selected bias level and a selected ICQ (decision block 308), the method 300 may proceed to iteratively select each of the suitable RGI values (process block 306) to add to the matrix in combination with the selected bias level and selected ICQ.

After adding each combination of RGIs with the selected bias level and selected ICQ, if there are additional suitable ICQs for the selected bias level (decision block 310), each of the additional suitable ICQs may iteratively be selected (process block 304) to add to the matrix in combination with the selected bias level. Accordingly, suitable RGIs may iteratively be selected (process block 306) to be added to the matrix with each of the iteratively selected ICQs and the selected bias level.

If additional suitable bias levels that have not been added to the matrix remain (decision block 312), the method 300 may then proceed to iteratively select each of the remaining suitable bias levels (process block 302). Accordingly, in some embodiments, the method 300 may sweep over each suitable combination of suitable bias levels, ICQs, and RGIs for the power amplifier 56. Though, in some embodiments, the method 300 may sweep over a subset of each of these suitable combinations based on existing hardware characterization of the power amplifier 56 and/or the transmitter and/or based on an input, which the electronic device 10 may receive via one or more of the input structure(s) 22.

Figure 13:
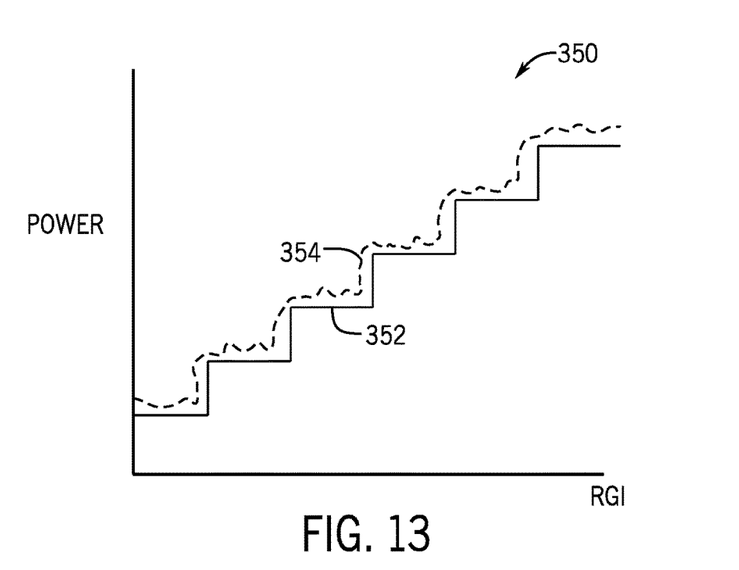
FIG. 13 is an embodiment of the plot of power consumed by the power amplifier of FIG. 7 operating using envelope tracking versus radio frequency gain of a signal input to the power amplifier.

To facilitate discussion of the operating characteristics of the power amplifier 56 using envelope tracking, FIG. 13 illustrates a plot 350 of a power amplifier's 56 supply power versus an RGI of a signal input to the power amplifier 56. The solid curve 352 may illustrate increasing power supply demand at the power amplifier 56 for increasing RGIs of the signal, while the dashed curve 354 may represent the actual power supplied to the power amplifier 56 in response to the signal with an increasing RGI. As discussed above, during envelope tracking, the transmitter 50 may adjust the power supplied to the power amplifier 56 in response to changes in the signal's envelope, which, for an input signal with a frequently varying envelope, may result in frequent power supply changes, as illustrated by the inconstant dashed curve 354.

Figure 14:
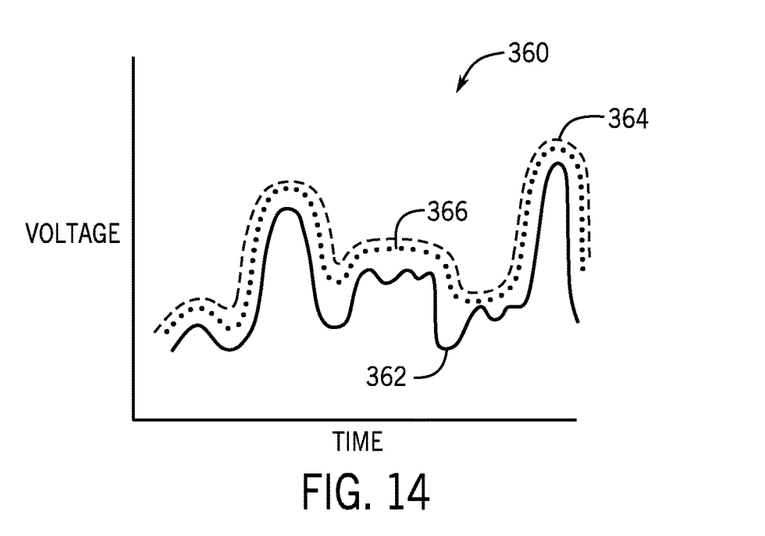
FIG. 14 is an embodiment of the plot of a function of voltage supplied to the power amplifier of FIG. 7 operating using envelope tracking versus time.

For a more detailed depiction of envelope tracking over a varying input signal, FIG. 14 illustrates a plot 400 of voltage versus time for an input signal curve 362, a normal power operation mode voltage supply curve 364, and a low power operation mode voltage supply curve 366. Accordingly, the input signal curve 362 may be representative of the shape of the input signal 52 over time and/or of the signal input to the power amplifier 56. The normal power operation mode voltage supply curve 364 may represent the voltage and/or power, which is proportional to the voltage, supplied to the power amplifier 56 in a normal power operation mode using envelope tracking. Accordingly, as the amplitude of the input signal curve 362 varies over time, the normal power operation mode voltage supply curve 364 may track the general shape of the envelope of the input signal curve 362, which may result in frequent changes in power supplied to the power amplifier 56.

As discussed herein, to reduce power consumed at the power amplifier 56, the transmitter 50 may operate in the low power operation mode. In the low power operation mode, to reduce the margin by which signal transmission requirements, such as ACLR, are exceed by, the envelope tracking illustrated in the normal power operation mode voltage supply curve 364 may be modified to produce the low power operation mode voltage supply curve 366. More specifically, the envelope tracking techniques employed by the power amplifier power supply path 70 may be modified to reduce the margin between the input signal curve 362 and the voltage supplied to and/or ICQ set point of the power amplifier 56. Accordingly, the power consumed by the power amplifier 56 may be reduced. Further, the envelope tracking techniques resulting in low power operation mode voltage supply curve 366 may include de-troughing the input signal curve's 362 envelope to reduce swings in power supplied to the power amplifier. That is, in some embodiments, to ensure a minimum voltage and/or power is supplied to the power amplifier 56, the low power operation mode voltage supply curve 366 may not follow the input signal's envelope as it dips below a certain threshold. Accordingly, the low power operation mode may reduce swings between low power supplies and higher power supplies as the envelope of the input signal drops down into a trough and then peaks higher.

To configure the transmitter 50 to operate in low power operation mode using envelope tracking, the method 250 may be modified to suitably calibrate the LUT 86. In some embodiments, for example, after constructing the matrix of combinations of power amplifier input settings (process block 252), determining the respective power operating settings of the power amplifier (process block 254) may involve using the data in the matrix to determine the bias level and ICQ combinations that meet the power and/or ACLR transmission standards. Then to identify optimal amplifier input setting combinations (process block 256), for each of the identified bias level and ICQ combinations, one or more detroughs after linearization of possible input signal voltages to the power amplifier 56 are measured. For each combination of bias level, ICQ, and detrough, the ALCR margin and/or other power operating settings of the power amplifier 56 may be determined. Using a weighted objective function, a detrough resulting in a bias level and ICQ combination having a suitable ACLR margin may be determined for each bias level and ICQ combination. Accordingly, these settings may then be stored in LUT 86 for use by the power amplifier power supply path 70 and/or the transmitter 50.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A transmitter, comprising:
a power amplifier configured to receive an input signal; and
a control circuit operably coupled to the power amplifier, the control circuit having a first mode of operation to cause the power amplifier to generate, based at least in part on the input signal, an output signal meeting an adjacent channel leakage ratio (ACLR) by a first margin and the control circuit having a second mode of operation to cause the power amplifier to generate, based at least in part on the input signal, the output signal meeting the ACLR by a second margin, wherein the second margin is smaller than the first margin, wherein the control circuit is configured to generate the output signal based at least in part on one or both of average power tracking of the input signal or envelope tracking of the input signal.

2. The transmitter of claim 1, wherein, the control circuit is configured to generate one or both of a voltage supply signal or a quiescent current signal to power the power amplifier based at least in part on one or more characteristics of the input signal, wherein the power amplifier is configured to generate the output signal based at least in part on one or both of the voltage supply signal or the quiescent current signal.

3. The transmitter of claim 2, wherein the one or more characteristics comprise one or both of an envelope of the input signal or a peak voltage of the input signal.

4. The transmitter of claim 2, wherein the control circuit comprises:
an input analysis circuit having a first look up table corresponding to the first mode of operation and a second look up table corresponding to the second mode of operation, the input analysis circuit being configured to:
receive an unprocessed signal; and
in the first mode of operation:
generate an unprocessed voltage supply signal based at least in part on one or more characteristics of the unprocessed signal and on the first look up table; and
generate an unprocessed quiescent current signal based at least in part on the one or more characteristics of the unprocessed signal and on the first look up table; and
in the second mode of operation:
generate the unprocessed voltage supply signal based at least in part on the one or more characteristics of the unprocessed signal and on the second look up table; and
generate the unprocessed quiescent current signal based at least in part on the one or more characteristics of the unprocessed signal and on the second look up table;
a voltage supply digital-to-analog converter (DAC) operably coupled to the input analysis circuit, the voltage supply DAC being configured to convert the unprocessed voltage supply signal to an analog signal;
a current supply DAC operably coupled to the input analysis circuit, the current supply DAC being configured to convert the unprocessed quiescent current signal to the quiescent current signal; and
a dynamic voltage supply circuit operably coupled to the voltage supply DAC, the dynamic voltage supply circuit being configured to receive the analog signal and configured to generate the voltage supply signal.

5. The transmitter of claim 2, wherein the control circuit comprises:
a first look up table corresponding to the first mode of operation, the first look up table having a first mapping of data representative of a radio frequency gain index (RGI) of the input signal to first data representative of the voltage supply signal and a second mapping of the data representative of the RGI of the input signal to first data representative of the quiescent current signal; and
a second look up table corresponding to the second mode of operation, the second look up table having a third mapping of the data representative of the RGI of the input signal to second data representative of the voltage supply signal and a fourth mapping of the data representative of the RGI of the input signal to second data representative of the quiescent current signal.

6. The transmitter of claim 5, wherein the second data representative of the quiescent current signal corresponds to the quiescent current signal having a smaller absolute value than the first data representative of the quiescent current signal.

7. The transmitter of claim 1, wherein the transmitter is configured to receive an unprocessed input signal and configured to generate the input signal based at least in part on the unprocessed input signal.

8. The transmitter of claim 7, comprising:
a digital pre-distortion circuit configured to introduce distortion to the unprocessed input signal to generate a distorted signal, wherein the distortion offsets distortion generated by the power amplifier;
a digital-to-analog converter (DAC) configured to convert the distorted signal from a digital signal to an analog signal to generate a distorted analog signal; and
a mixer configured to modulate a frequency, an amplitude, or a combination thereof of the distorted analog signal to generate the input signal.

9. The transmitter of claim 7, comprising digital gain circuitry, wherein the digital gain circuitry is configured to adjust a radio frequency gain index of the unprocessed input signal to generate the input signal.

10. A method of operating a power amplifier of a transmitter having a normal power operation mode and a low power operation mode, comprising:
in the normal power operation mode:
receiving an input signal at the power amplifier;
generating, via the power amplifier, an output signal configured to meet an adjacent channel leakage ratio (ACLR) by a first margin;
receiving, via one or more processors communicatively coupled to the transmitter, an instruction to operate the transmitter in low power operation mode; and
configuring the transmitter to operate in low power operation mode; and
in the low power operation mode:
receiving the input signal at the power amplifier; and generating, via the power amplifier, the output signal configured to meet the ACLR by a second margin, wherein the second margin is smaller than the first margin.

11. The method of claim 10, wherein the one or more processors are configured to receive the instruction in response to one or both of determining a battery life of an electronic device comprising the transmitter is at a percentage or receiving a command from an input device communicatively coupled to the electronic device.

12. The method of claim 10, comprising:
in the normal power operation mode:
receiving a first voltage supply signal at the power amplifier, wherein the first voltage supply signal is based at least in part on one or more characteristics of the input signal;
receiving a first quiescent current signal at the power amplifier, wherein the first quiescent current signal is based at least in part on the one or more characteristics of the input signal; and
generating, via the power amplifier, the output signal based at least in part on the first voltage supply signal, the first quiescent current signal, and the input signal; and
in the low power operation mode:
receiving a second voltage supply signal at the power amplifier, wherein the second voltage supply signal is based at least in part on the one or more characteristics of the input signal;
receiving a second quiescent current signal at the power amplifier, wherein the second quiescent current signal is based at least in part on the one or more characteristics of the input signal, wherein the second quiescent current signal is lower in absolute value than the first quiescent current signal; and
generating, via the power amplifier, the output signal based at least in part on the second voltage supply signal, the second quiescent current signal, and the input signal.

13. The method of claim 10, comprising:
in the normal power operation mode:
generating, via the power amplifier, the output signal based at least in part on contents of a first look up table; and
in the low power operation mode:
generating, via the power amplifier, the output signal based at least in part on contents of a second look up table.

14. A method of calibrating a power amplifier to reduce current consumption used to generate an output signal, comprising:
determining a plurality of combinations of one or more power amplifier input settings;
determining, for each of the plurality of combinations, one or more power operating settings resulting from the power amplifier receiving respective combinations of power amplifier input settings;
determining one or more optimal combinations of power amplifier input settings from among the plurality of combinations based at least in part on the respective one or more power operating settings resulting from the power amplifier receiving the one or more optimal combinations of power amplifier input settings; and
storing the one or more optimal combinations of power amplifier input settings in non-transitory memory.

15. The method of claim 14, wherein the one or more power amplifier input settings comprise a supply voltage, a quiescent current, a radio frequency gain index, or a combination thereof, input to the power amplifier.

16. The method of claim 15, wherein an optimal combination of power amplifier input settings of the one or more optimal combinations of power amplifier input settings comprises an additional quiescent current having a smallest absolute value corresponding to a suitable adjacent channel leakage ratio, and wherein the respective one or more power operating settings resulting from the power amplifier receiving the optimal combination of power amplifier input settings comprise the suitable adjacent channel leakage ratio.

17. The method of claim 15, wherein storing the one or more optimal combinations of power amplifier input settings in the non-transitory memory comprises storing data representative of the supply voltage and the quiescent current mapped to data representative of the radio frequency gain index in a look up table.

18. The method of claim 14, wherein the power amplifier is disposed within a transmitter.

* * * * *